METHOD OF FABRICATION OF SEMICONDUCTOR DEVICES

Filed July 21, 1971

Inventors:
JOSEPH H. BANFIELD,
SALEEM Y. HUSNI &
WILLIAM J. GREIG

BY M. Y. Epstein
ATTORNEY

United States Patent Office 3,686,080

Patented Aug. 22, 1972

3,686,080

METHOD OF FABRICATION OF SEMICONDUCTOR DEVICES

Joseph Henry Banfield, Plainfield, Saleem Ynes Husni, Mendham, and William John Greig, Somerville, N.J., assignors to RCA Corporation

Continuation-in-part of application Ser. No. 786,218, Dec. 23, 1968. This application July 21, 1971, Ser. No. 164,950

Int. Cl. C23b *5/48;* B44d *1/18;* B22b *31/14*

U.S. Cl. 204—15 6 Claims

ABSTRACT OF THE DISCLOSURE

In the fabrication of certain types of semiconductor devices, a semiconductor substrate is provided with successive layers of a first layer of titanium, a second layer of a member of the platinum group of metals, and a third layer of titanium, the layers preferably being provided in a protective atmosphere. Portions of the uppermost layer of titanium are selectively etched to expose portions of the second layer. The exposed portions of the second layer are then immediately etched away, the remaining portions of the uppermost titanium layer serving as an etch mask in the process. The portions of the bottom layer of titanium exposed by the etching of the second layer are coated with an electrically non-conductive coating, other portions of the second layer are exposed by removal of the overcoating of titanium therefrom, and gold is immediately thereafter plated onto the newly exposed second layer portions.

CROSS-REFERENCE TO RELATED APPLICATION

This is a continuation-in-part of application Ser. No. 786,218, filed Dec. 23, 1968 and now abandoned.

BACKGROUND OF THE INVENTION

This invention relates to the fabrication of semiconductor devices.

Certain types of semiconductor devices comprise a semiconductor pellet having spaced depositions of gold on a surface thereof. To improve the adherence of the gold to the substrate, an intermediate layer of titanium is used. To prevent diffusion of the gold into the titanium, an intermediate layer of a member of the platinum group of metals is used.

In the fabrication of such devices, the usual practice is to coat a surface of the substrate with a first layer of titanium, coat the titanium with a second layer of a platinum group metal, selectively etch away portions of the second layer leaving spaced islands thereof, mask the otherwise exposed portions of the titanium layer between the islands, and plate gold onto the islands.

Problems in the past have been that of selectively etching away the portions of the platinum group metal in an accurate and reproducible manner, and plating the gold with good adherence to the platinum group metal. Members of the platinum group of metals are relatively inert, and the use of an adequately strong etchant often results in the removal of the mask used in the etching process. Thus, portions of the platinum group metal are undesirably exposed to the etchant. Additionally, it is found that the etching and plating characteristics of the platinum group metals are quite variable, some workpieces of an apparently identical batch of workpieces being satisfactory upon being processed, while others of the batch are defective upon being exposed to the identical processing.

DESCRIPTION OF PREFERRED EMBODIMENTS

Figure 1:
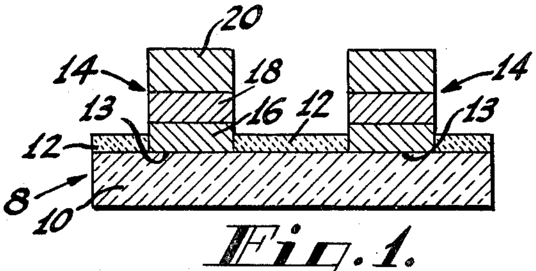
FIG. 1 is a side view, in section, of a workpiece made in accordance with the present invention.

With reference to FIG. 1, there is shown a workpiece 8 in an intermediate stage in its fabrication into a semiconductor device. The workpiece 8 comprises a semiconductor substrate 10 of silicon, gallium arsenide, or the like. Covering portions of the surface of the substrate 10 is a protective layer 12, such as silicon dioxide, or the like, having a thickness in the order of 5,000 angstroms. Extending through openings in the layer 12 and into contact with surface portions 13 of the substrate 10 are spaced metal pads 14 which serve as electrical contacts for various electrodes within the substrate. The pads 14 comprise a first layer 16 of a metal having a thickness in the order of 1,000 angstroms. The metal of the layer 16 is one which adheres well to the substrate 12. Examples of a suitable metal are titanium, tantalum, and rhodium. Additional criteria used for the selection of the metal of the layer 16 appear hereinafter.

Disposed on the layer 16 is a layer 18 of a member of the platinum group of metals, i.e., platinum, palladium, ruthenium, oxmium, rhodium, and iridium. In this embodiment, the layer 18 is of platinum having a thickness in the order of 3,000 angstroms.

Disposed on the platinum layer 18 is a layer 20 of gold having a thickness in the order of 10,000 to 30,000 angstroms.

The workpiece 8 is eventually procesed into a semiconductor device, e.g., a transistor. Details of such processing are not provided, since they form no part of the present invention.

Heretofore, the fabrication of the workpiece 8 presented severe problems with respect to, as previously noted, the etching of the platinum group metal and the plating of gold onto the platinum group metal. After much experimentation in attempts to solve these problems, it was discovered that the etching and plating characteristics of the platinum group metals appear to vary, in a random manner, with the time the platinum group metal surface is exposed to the atmosphere, and with exposure to the various chemicals and procedures utilized in the prior art processes.

Starting with this discovery, the following process for fabricating the workpiece 8 to the point shown in FIG. 1 was developed.

Figure 2:
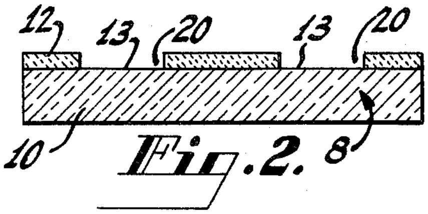

The starting workpiece 8 comprises (FIG. 2) the substrate 10 having the protective layer 12 thereon, with openings 20 through the layer 12. The substrate 10 contains various regions (not shown) of different conductivity type which provide the desired electrical, e.g., transistor, characteristics in the finished device. The openings 20 through the layer 12 expose surface portions 13 of certain ones of these regions, whereby electrical connections, i.e., the pads 14 (FIG. 1), can be made thereto. Methods for fabricating the workpiece 8 to the point shown in FIG. 2 are known, and are not described herein.

The workpiece 8 is next provided (FIG. 3) with a first layer 16 of metal, e.g., titanium, having a thickness in the order of 1,000 angstroms, a second layer 18 of platinum, having a thickness in the order of 3,000 angstroms, and a third layer 22 of a metal, e.g., titanium, having a thickness in the order of 500 to 1,000 angstroms. As shown, portions of the first layer 16 extend through the openings 20 in the protective layer 12 and into contact with the surface portions 13 of the substrate 10. Although not illustrated, the surface portions 13 of the substrate 10 may be covered with a thin, e.g., 1,000 angstroms thick, layer of platinum silicide for the purpose of obtaining a good ohmic contact between the pads 14 and the substrate 10. The use of, and processes for providing, such platinum silicide layers are known. Also, if another metal of the platinum group is being used for the layer 18, it is convenient to cover the surface portions 13 with a silicide of such other metal.

Preferably, both the platinum layer 18 and the covering layer 22 are applied to the substrate 10 in a protective atmosphere, such as argon, or in a vacuum, without exposing the platinum surface to the earth's atmosphere in the process.

A convenient means of accomplishing this is to apply the layers 16, 18, and 22 in sequence in a sputtering system. Such systems, as known, comprise an enclosure containing a protective atmosphere, such as argon, and one or more targets of the materials to be sputtered onto a substrate placed in the enclosure. An electrical potential difference is applied between the substrate and the target to be sputtered, and the substrate is coated with the material sputtered off the target by the bombardment of the target with ions of the argon atmosphere. Various layers of the target materials on the substrate are obtainable by switching the applied voltage to the different targets in turn. The system is not opened to the earth's atmosphere during the process, whereby exceptionally clean layers of metal are obtainable.

Other processes wherein successive layers of metal can be applied to a substrate without exposure of the layers to the earth's atmosphere during the process, such as electron beam evaporation of metals, can be used.

Any of a number of metals, such as titanium, tantalum, or rhodium, which can be applied by a process of the type described, can be used for the third layer 22. For convenience, to limit the number of metal sources required, the first layer 16 and the third layer 22 are preferably of the same metal. A further criterion for the selection of the metals of these layers appears hereinafter.

The third layer 22 protects the platinum layer 18 from the earth's atmosphere upon removal of the workpiece from the apparatus in which the layers are applied. This, as discovered, prevents variations in the etching and plating characteristics of the platinum upon storage of the workpiece.

Figure 5:
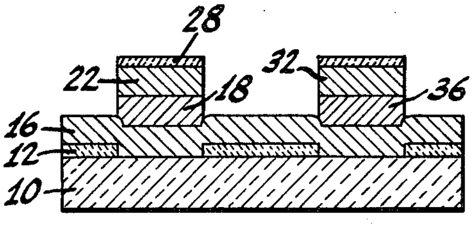
FIGS. 2 through 7 are side views in section showing successive steps in the fabrication of the workpiece shown in FIG. 1.
Figure 3:
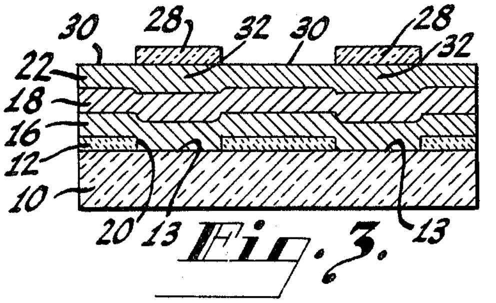
Figure 4:
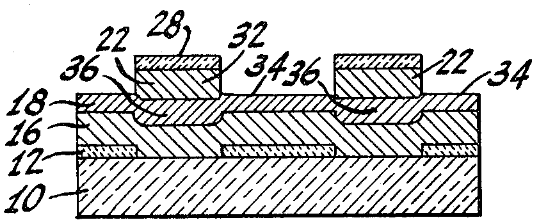

Thereafter, the spaced pads 14 are formed. This is accomplished by first covering the third layer 22 with a layer of photoresist, such as the KPR photoresist sold by the Eastman Kodak Company, exposing the photoresist material through a mask, and etching away the unexposed portions of the photoresist material to provide an etch resistant mask 28, as shown in FIG. 3. Portions 30 of the third layer 22 are exposed by the mask 28, while portions 32 of the layer 22 are protected by the mask 28. The exposed portions 30 are then etched away. For a layer 22 of titanium, for example, the etchant comprises water, sulphuric acid, and hydrofluoric acid. The result of the third layer etching is shown in FIG. 4. Portions 34 of the platinum layer 18 are exposed, while portions 36 thereof remain covered by the third layer portions 22. The exposed platinum portions 34 are then etched away using an etchant comprising 5 parts hydrochloric acid and 1 part nitric acid. It is desired, at this point in the processing, that the first layer 16 be unaffected by the platinum etching step. Hence, the metal of the first layer is one, such as the metals enumerated, which is resistant to the platinum etchant used. The result of the platinum etching step is shown in FIG. 5.

Two points are to be here noted. First, the platinum etchant used is considerably stronger than that used in the prior art (e.g., 10 parts water, 9 parts hydrochloric acid, and 1 part nitric acid). Heretofore, the use of a relatively weak etchant was required to prevent lifting of the photoresist etching mask and exposure of undesired portions of the platinum to the etchant. The use of a weak etchant, in turn, requires the use of a relatively thin layer of platinum (e.g., in the order of 1,500 angstroms thick) in order that the platinum layer can be etched through with at least some degree of accuracy and reproducibility. A problem with the use of thin layers of platinum, however, is that the number of tiny holes through the platinum layer, known as "pinholes" is generally more or less inversely related to the thickness of the layer. The presence of such pinholes is undesirable, as known.

In the instant process, the metal of the third layer is one, such as the metals enumerated, which is resistant to the platinum etchant used and which adheres extremely well, in comparison with standard photoresist materials, to the platinum. Thus, the portions 32 (FIG. 4) of the third layer 22 serve as a high quality etch mask in the platinum etching process, and a stronger etchant can be used. This in turn, allows the use of thicker layers of platinum having fewer pinholes, hence, better quality devices. In the practice of this invention, layers of platinum having thicknesses as high as 5,000 angstroms have been used.

Second, the platinum etching step is performed "immediately" after the portions 34 of the platinum layer 20 are exposed. This is done to prevent any platinum surface "aging," i.e., variations in the platinum surface etching characteristics. Preferably, the workpiece is lifted out of the third layer 22 etchant bath, washed in distilled water to remove the etchant, and transferred to the platinum etchant bath in the time required to perform these operations, i.e., without any storage of the workpieces between these operations. While the speed of the transfer of the workpiece from operation to operation is not critical, as to seconds, or even minutes, delays in the order of several hours during which the platinum surface is exposed to the atmosphere are to be avoided.

By first protecting the platinum layer with a covering layer, and thereafter "immediately" etching the platinum after it is exposed, consistent and reproducible etching of the platinum layers from workpiece to workpiece is obtained.

Figure 6:
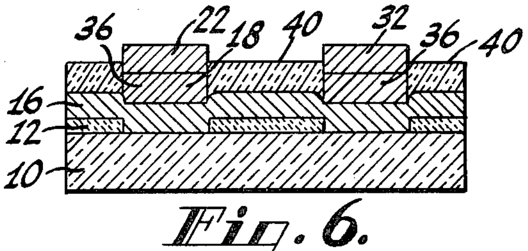

The remaining portions of the photoresist mask 28 are then removed, and using known photolithographic processes, the portions of the first layer 16 between the platinum portions 36 are covered by an electrically non-conductive photoresist layer 40, as shown in FIG. 6, while the third layer portions 32 covering the platinum portions 36 are left uncovered.

Figure 7:
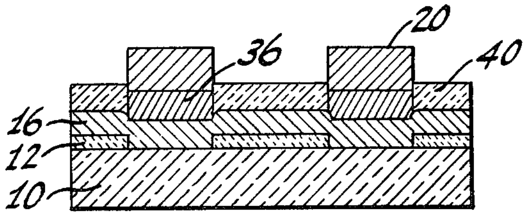

The exposed third layer portions 32 are then removed, using the water, sulfuric and hydrofluoric acids etchant, thereby exposing, for the first time, the remaining portions 36 of the platinum layer 18. "Immediately" thereafter, gold is plated onto the platinum portions 36 to form the gold layers 20, as shown in FIG. 7. An electrolytic process is used to plate the gold onto the platinum portions 36. Electrical connections to the platinum portions, needed for the electrolytic process, are made via the still intact first layer 16 which underlies each platinum portion 36, and which extends to the edge of the substrate 10. Electrical contact to the layer 16 is made, for example, by means of a clip, not shown, which penetrates the masking layer 40. Plating of the first layer 16 is prevented by the presence of the electrically non-conductive layer 40.

By "immediately" is again meant the avoidance of storage of the workpiece for periods in the order of several hours.

The prior protection of the platinum portions 36 by the portions 32 of the third layer 22, and the plating of the platinum portions 36 with gold "immediately" upon the exposure of the portions 36, results in high quality, strongly adherent, and reproducible plating of gold onto the platinum.

While gold is the preferred material for the topmost layer 20 of the pads 14, other metals, such as silver, copper, or the like can be used.

The remaining portions of the photoresist layer 40 are then removed, using a known photoresist stripper, thereby exposing the portions of the layer 16 not covered by the platinum portions 36. These exposed portions are then etched away to provide the workpiece shown in FIG. 1. The etchant used, e.g., sulfuric acid, hydrofluoric acid, and water, used in the case of a layer 16 of titanium, does not attack gold or platinum.

As previously noted, in some instances, other members of the platinum group of metals can be used in place of platinum. For example, palladium is used, depending upon the particular device being made, for the reason that palladium can be deposited by the known filament evaporation process. As known, such evaporation processes tend to be less damaging of the devices being fabricated than are the sputtering processes generally used to deposit platinum. By way of example, the palladium layers can have a thickness in the range of 3,000 to 5,000 angstroms.

While the other members of the platinum group of metals are generally somewhat easier to work with than platinum, especially with respect to achieving consistent etching thereof, the above-described problems affecting the use of platinum generally affect the use of these other metals. Thus, the instant invention has utility when these other metals are used.

In general, the various processes and reagents described above in connection with the fabrication of devices utilizing platinum can be used with devices using other members of the platinum group. In addition, certain etchants not normally used for platinum can be used with at least certain ones of these metals, as known. For example, an etchant comprising nitric acid with about 1%, by volume, of hydrochloric acid can be used to etch palladium.

We claim:

1. In a method of fabricating a semiconductor device, the improvement comprising:

covering a semiconductor substrate with a first layer of a metal having a strong adherence to said substrate;

covering said first layer with a second layer of a member of the platinum group of metals;

coating said second layer with a third layer of a metal effective to protect said second layer from ambient contaminants;

providing an opening through said third layer to expose a first portion of said second layer;

immediately thereafter, etching away said first portion using an etchant that does not attack the metals of said first and third layers;

thereafter exposing a second portion of said second layer through said third layer; and immediately thereafter, selectively plating a metal onto said second portion.

2. The method of claim 1 including the subsequent steps of:

covering the portion of said first layer exposed by the etching away of said first portion with an electrically non-conductive coating; and using said first layer as an electrode, electrolytically plating said metal onto said second portion, said non-conductive coating preventing plating of said metal on the portion of said first layer covered by said coating.

3. The method of claim 1 wherein said second and third layers are provided without exposing said second layer to the earth's atmosphere.

4. The method of claim 3 wherein:

said second layer is of platinum having a thickness in the order of 3,000 angstroms;

said first portion is etched away using an etchant having a composition in the order of 5 parts hydrochloric acid and 1 part nitric acid; and gold is plated onto said second portion.

5. The method of claim 3 wherein said second layer is of platinum.

6. The method of claim 3 wherein said second layer is of palladium.

References Cited

UNITED STATES PATENTS

| | | | |
|---|---|---|---|
| 3,388,048 | 6/1968 | Szabo, Jr. | 204—15 |
| 3,507,756 | 4/1970 | Wenger | 204—15 |

JOHN H. MACK, Primary Examiner

T. TUFARIELLO, Assistant Examiner

U.S. Cl. X.R.

117—212; 156—3, 17